(12) United States Patent
Wu et al.

(10) Patent No.: US 10,115,909 B2
(45) Date of Patent: Oct. 30, 2018

(54) ORGANIC ELECTROLUMINESCENT DEVICE, MANUFACTURING METHOD THEREOF AND ELECTRONIC EQUIPMENT

(71) Applicants: Boe Technology Group Co., Ltd., Beijing (CN); Ordos Yuansheng Optoelectronics Co., Ltd., Inner Mongolia (CN)

(72) Inventors: Haidong Wu, Beijing (CN); Yun Qiu, Beijing (CN); Weilin Lai, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 246 days.

(21) Appl. No.: 14/907,047

(22) PCT Filed: Aug. 21, 2015

(86) PCT No.: PCT/CN2015/087775
§ 371 (c)(1),
(2) Date: Jan. 22, 2016

(87) PCT Pub. No.: WO2016/165259
PCT Pub. Date: Oct. 20, 2016

(65) Prior Publication Data
US 2017/0179405 A1    Jun. 22, 2017

(30) Foreign Application Priority Data
Apr. 16, 2015   (CN) .......................... 2015 1 0180124

(51) Int. Cl.
*H01L 51/00*    (2006.01)
*C09K 11/06*    (2006.01)
(Continued)

(52) U.S. Cl.
CPC .......... *H01L 51/0072* (2013.01); *C09K 11/06* (2013.01); *H01L 51/005* (2013.01);
(Continued)

(58) Field of Classification Search
None
See application file for complete search history.

(56) References Cited

U.S. PATENT DOCUMENTS 7,572,522 B2 *   8/2009   Seo ........................ H01L 51/002
                                                  257/101
9,299,942 B2 *   3/2016   Seo ....................... H01L 51/5004
(Continued)

FOREIGN PATENT DOCUMENTS

CN    1607878    4/2005
CN    1822409    8/2006
(Continued)

OTHER PUBLICATIONS

Office action from Chinese Application No. 201510180124.7 dated Sep. 13, 2016.
(Continued)

*Primary Examiner* — Michael Lebentritt
*Assistant Examiner* — Jordan Klein
(74) *Attorney, Agent, or Firm* — Calfee, Halter & Griswold LLP

(57) ABSTRACT

The embodiments of the present invention provide an organic electroluminescent device, a manufacturing method thereof and an electronic equipment. The organic electroluminescent device comprises: an anode layer, a hole transport layer, a first light emitting layer, a second light emitting layer, an electron transport layer, and a cathode layer stacked in sequence; wherein the first light emitting layer and the second light emitting layer comprise a same substrate material; the first light emitting layer and/or the second light
(Continued)

emitting layer are doped such that a hole mobility of the first light emitting layer is equal to an electron mobility of the second light emitting layer. In the embodiments of the present invention, two light emitting layers with the same substrate material are applied, which can realize a balanced injection for electrons and holes, thereby improving the efficiency and lifetime of the organic electroluminescent device.

20 Claims, 2 Drawing Sheets

(51) Int. Cl.
    *H01L 51/56*       (2006.01)
    *H01L 51/50*       (2006.01)
    *H01L 51/52*       (2006.01)

(52) U.S. Cl.
    CPC .......... *H01L 51/006* (2013.01); *H01L 51/007* (2013.01); *H01L 51/0054* (2013.01); *H01L 51/0059* (2013.01); *H01L 51/0065* (2013.01); *H01L 51/0067* (2013.01); *H01L 51/0077* (2013.01); *H01L 51/0081* (2013.01); *H01L 51/0084* (2013.01); *H01L 51/0086* (2013.01); *C09K 2211/1007* (2013.01); *C09K 2211/1011* (2013.01); *C09K 2211/1014* (2013.01); *C09K 2211/181* (2013.01); *C09K 2211/185* (2013.01); *C09K 2211/188* (2013.01); *H01L 51/0058* (2013.01); *H01L 51/504* (2013.01); *H01L 51/5012* (2013.01); *H01L 51/5056* (2013.01); *H01L 51/5072* (2013.01); *H01L 51/5206* (2013.01); *H01L 51/5221* (2013.01); *H01L 51/56* (2013.01); *H01L 2051/0063* (2013.01); *H01L 2251/301* (2013.01); *H01L 2251/305* (2013.01); *H01L 2251/306* (2013.01); *H01L 2251/308* (2013.01)

(56) References Cited

U.S. PATENT DOCUMENTS

2006/0194077 A1* 8/2006 Noguchi ............. H01L 51/5012
                                                            428/690
2009/0189509 A1* 7/2009 Qiu .................... H01L 51/0058
                                                            313/498
2011/0015404 A1* 1/2011 Koch .................... C07D 249/08
                                                        548/266.2
2013/0037752 A1* 2/2013 Koch .................... C07C 43/215
                                                        252/500
2014/0054571 A1* 2/2014 Yang ...................... H01L 51/56
                                                          257/40
2014/0175401 A1* 6/2014 Jeong ................. H01L 51/0094
                                                          257/40
2014/0175402 A1* 6/2014 Jeong .................... C07D 401/14
                                                          257/40
2015/0102331 A1* 4/2015 Seo ..................... H01L 51/504
                                                          257/40
2015/0287947 A1* 10/2015 Yamamoto ............ H01L 51/504
                                                         257/40
2015/0287948 A1* 10/2015 Fukase .................. H01L 51/504
                                                         257/40
2016/0163771 A1* 6/2016 Jang .................... H01L 27/3206
                                                          257/40

FOREIGN PATENT DOCUMENTS

| CN | 1910961 | 2/2007 |
|---|---|---|
| CN | 1957645 | 5/2007 |
| CN | 101074660 | 11/2007 |
| CN | 101395696 | 3/2009 |
| CN | 101562232 | 10/2009 |
| CN | 101679654 | 3/2010 |
| CN | 102074660 | 5/2011 |
| CN | 102969459 | 3/2013 |
| CN | 103050634 | 4/2013 |
| CN | 104795507 | 7/2015 |
| JP | 2008053664 | 3/2008 |
| WO | 2013/159514 | 10/2013 |

OTHER PUBLICATIONS

Office action from Chinese Application No. 201510180124.7 dated Jul. 6, 2016.
International Search Report and Written Opinion from PCT/CN15/87775 dated Dec. 2, 2015.

* cited by examiner

ORGANIC ELECTROLUMINESCENT DEVICE, MANUFACTURING METHOD THEREOF AND ELECTRONIC EQUIPMENT

RELATED APPLICATIONS

The present application is the U.S. national phase entry of PCT/CN2015/087775, with an international filing date of Aug. 21, 2015, which claims the benefit of Chinese Patent Application No. 201510180124.7, filed on Apr. 16, 2015, the entire disclosures of which are incorporated herein by reference.

FIELD OF THE INVENTION

The present invention relates to the field of display technology, particularly to an organic electroluminescent device, a manufacturing method thereof and an electronic equipment.

BACKGROUND OF THE INVENTION

Organic electroluminescent devices (OLED) are highly valued in flat panel display and lighting fields due to the advantages of high brightness, color saturation, thin and light, flexible and so on. At present, a common organic electroluminescent device mainly comprises top-emitting device structure and bottom-emitting device structure. Compared with the bottom-emitting device structure, the top-emitting device structure has advantages of high aperture ratio, high color purity, easy to realize high PPI and so on. Therefore, the top-emitting device structure has become the mainstream of organic electroluminescent device structure. However, there are some problems in the structure of top-emitting organic electroluminescent devices, such as low efficiency, high driving voltage, poor lifetime, viewing angle and so on.

The existing organic electroluminescent device structure typically comprises an anode layer, a hole transport layer (HTL, hole transport layer), a light emitting layer (EML, emissive layer), an electron transport layer (ETL, electron transport layer), and a cathode layer (as shown in FIG. 1). The working principle of the device is: holes are injected from the anode, and transported on the HOMO energy level (highest occupied molecular orbital) of the hole transport layer, eventually reaching the HOMO energy level of the light emitting layer; electrons are injected from the cathode, and transported on the LUMO energy level (lowest unoccupied molecular orbital) of the electron transport layer, eventually reaching the LUMO energy level of the light emitting layer. Under the action of applied voltage, the electrons on the LUMO energy level of the light emitting layer are combined with the holes on the HOMO energy level of the light emitting layer, so as to realize light emitting of the organic electroluminescent device. Typically, an optimal device structure should realize a balanced injection for electrons and holes, such that each of the electrons and holes is recombined, so as to obtain a device structure with high efficiency. However, it is difficult to obtain a light emitting material, of which the electron mobility and hole mobility are the same.

Due to the inconsistency between the electron-transport ability and hole-transport ability in the light emitting layer, the electrons and holes transported to the interface of the light emitting layer can not enter the light emitting layer and recombine with a same number, which is not beneficial for improving the efficiency and lifetime of the organic electroluminescent device.

SUMMARY OF THE INVENTION

In view of this, the embodiments of the present invention provide an organic electroluminescent device and a manufacturing method thereof, which can realize a balanced injection for electrons and holes, thereby improving the efficiency and lifetime of the organic electroluminescent device.

An embodiment of the present invention provides an organic electroluminescent device comprising:

an anode layer, a hole transport layer, a first light emitting layer, a second light emitting layer, an electron transport layer, and a cathode layer stacked in sequence;

wherein the first light emitting layer and the second light emitting layer comprise a same substrate material; the first light emitting layer and/or the second light emitting layer are doped such that a hole mobility of the first light emitting layer is equal to an electron mobility of the second light emitting layer.

The existing substrate material for the light emitting layer is typically a hole-transport material or an electron-transport material. The embodiment of the present invention uses a same substrate material to prepare two light emitting layers, and makes a hole mobility of the first light emitting layer close to the anode equal to an electron mobility of the second light emitting layer close to the cathode; in this way, a balanced injection for electrons and holes is realized, and physical properties of these two light emitting layers are also matched with each other. In the embodiments of the present invention, two light emitting layers with the same substrate material are applied, which can realize a balanced injection for electrons and holes, thereby improving the efficiency and lifetime of the organic electroluminescent device.

Optionally, the substrate material is 4-(dicyanomethylene)-2-tert-butyl-6-(1,1,7,7-tetramethyljulolidin-4-yl-vinyl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

Optionally, the first light emitting layer is doped with a p-type dopant; the p-type dopant is 2,3,5,6-tetrafluoro-7,7', 8,8'-tetracyanoquinodimethane (F4-TCNQ), tris(4-bromophenyl)aminium hexachloroantimonate (TBAHA), or 4,4',4''-tris(N-(1-naphthyl)-N-phenyl amino)triphenylamine (TNATA).

Optionally, the second light emitting layer is doped with a n-type dopant; the n-type dopant is 8-hydroxyquinoline lithium (Liq), lithium fluoride (LiF), tris(2,2'-bipyridyl) chromium (Cr(bpy)$_3$), or tris(2,2'-bipyridyl) ruthenium (Ru(bpy)$_3$).

Optionally, a material of the hole transport layer is N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl) benzidine (TPTE), or 1,3,5-tris(N-3-methylphenyl-N-phenylamino)benzene (TDAB).

Optionally, a material of the electron transport layer is 2-(4-biphenylyl)-5-phenyloxadiazole (PBD), 2,5-bis(1-naphthyl)-1,3,5-oxadiazole (BND), or 2,4,6-triphenoxy-1,3, 5-triazine (TRZ).

Optionally, a material of the anode layer is ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$).

Optionally, a material of the cathode layer is Mg, Ag, Al, Li, K, Ca, $Mg_xAg_{(1-x)}$, $Li_xAl_{(1-x)}$, $Li_xCa_{(1-x)}$, or $Li_xAg_{(1-x)}$.

An embodiment of the present invention also provides a method for manufacturing an organic electroluminescent device. The method comprises:

stacking an anode layer, a hole transport layer, a first light emitting layer, a second light emitting layer, an electron transport layer, and a cathode layer in sequence;

wherein the first light emitting layer and the second light emitting layer comprise a same substrate material; the first light emitting layer and/or the second light emitting layer are doped such that a hole mobility of the first light emitting layer is equal to an electron mobility of the second light emitting layer.

The embodiment of the present invention uses a same substrate material to prepare two light emitting layers, and makes a hole mobility of the first light emitting layer close to the anode equal to an electron mobility of the second light emitting layer close to the cathode. In this way, a balanced injection for electrons and holes is realized, and physical properties of these two light emitting layers are also matched with each other. In the embodiments of the present invention, two light emitting layers with the same substrate material are applied, which can realize a balanced injection for electrons and holes, thereby improving the efficiency and lifetime of the organic electroluminescent device.

Optionally, the substrate material is 4-(dicyanomethylene)-2-tert-butyl-6-(1,1,7,7-tetramethyljulolidin-4-yl-vinyl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

Optionally, the first light emitting layer is doped with a p-type dopant; the p-type dopant is 2,3,5,6-tetrafluoro-7,7',8,8'-tetracyanoquinodimethane (F4-TCNQ), tris(4-bromophenyl)aminium hexachloroantimonate (TBAHA), or 4,4',4"-tris(N-(1-naphthyl)-N-phenyl amino)triphenylamine (TNATA).

Optionally, the second light emitting layer is doped with a n-type dopant; the n-type dopant is 8-hydroxyquinoline lithium (Liq), lithium fluoride (LiF), tris(2,2'-bipyridyl) chromium ($Cr(bpy)_3$), or tris(2,2'-bipyridyl) ruthenium ($Ru(bpy)_3$).

Optionally, a material of the hole transport layer is N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl) benzidine (TPTE), or 1,3,5-tris(N-3-methylphenyl-N-phenylamino)benzene (TDAB).

Optionally, a material of the electron transport layer is 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ).

Optionally, a material of the anode layer is ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$).

Optionally, a material of the cathode layer is Mg, Ag, Al, Li, K, Ca, $Mg_xAg_{(1-x)}$, $Li_xAl_{(1-x)}$, $Li_xCa_{(1-x)}$, or $Li_xAg_{(1-x)}$.

An embodiment of the present invention also provides an electronic equipment comprising the above mentioned organic electroluminescent device.

DETAILED DESCRIPTION OF THE INVENTION

Figure 1:
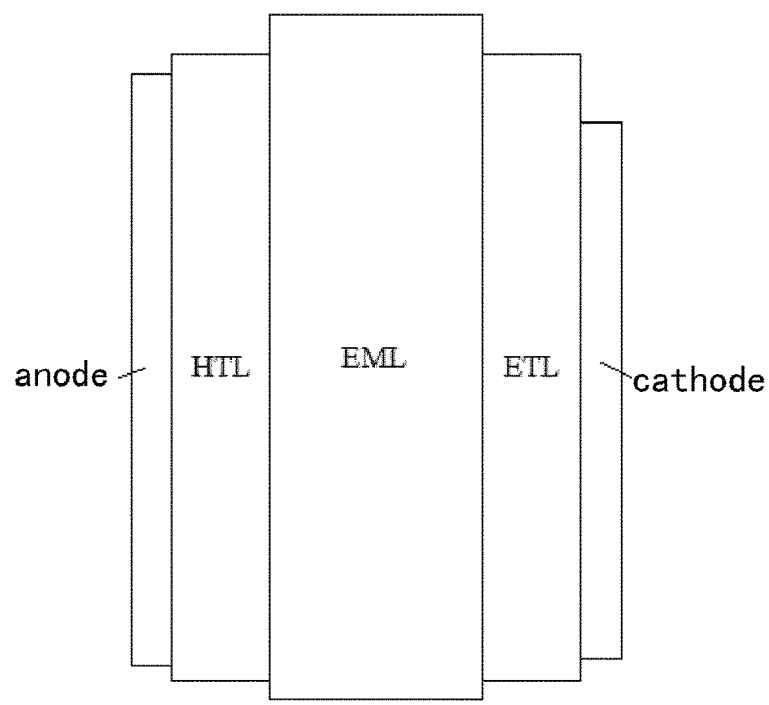
FIG. 1 is a structural schematic diagram of an organic electroluminescent device in the prior art.

The specific implementations of the organic electroluminescent device, manufacturing method thereof and electronic equipment provided by the embodiment of the present invention will be explained in detail below with reference to the drawings.

The thickness and the shape of the film layers in the drawings do not reflect the real proportion of the structure, but only aim to explain the contents of the present invention schematically.

Figure 2:
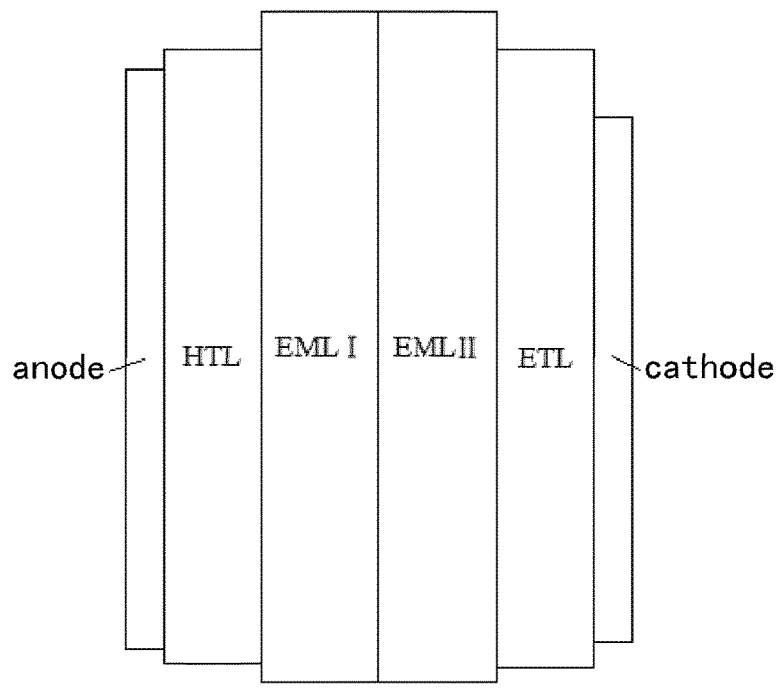
FIG. 2 is a structural schematic diagram of an organic electroluminescent device provided by the embodiment of the present invention.

FIG. 2 is a structural schematic diagram of an organic electroluminescent device provided by the embodiment of the present invention; the organic electroluminescent device comprises:

an anode layer, a hole transport layer HTL, a first light emitting layer EML I, a second light emitting layer EML II, an electron transport layer ETL, and a cathode layer stacked in sequence;

wherein the first light emitting layer EML I and the second light emitting layer EML II comprise a same substrate material. The first light emitting layer EML I and/or the second light emitting layer EML II are doped such that a hole mobility of the first light emitting layer EML I is equal to an electron mobility of the second light emitting layer EML II.

The existing substrate material for the light emitting layer is typically a hole-transport material or an electron-transport material. The embodiment of the present invention uses a same substrate material to prepare two light emitting layers, and makes a hole mobility of the first light emitting layer close to the anode equal to an electron mobility of the second light emitting layer close to the cathode. In this way, a balanced injection for electrons and holes is realized, and physical properties of these two light emitting layers are also matched with each other. In the embodiments of the present invention, two light emitting layers with the same substrate material are applied, which can realize a balanced injection for electrons and holes, thereby improving the efficiency and lifetime of the organic electroluminescent device.

In the embodiments of the present invention, the first light emitting layer EML I and the second light emitting layer EML II comprise a same substrate material. The first light emitting layer EML I and/or the second light emitting layer EML II are doped.

In particular, if the material of the light emitting layer (i.e., the applied substrate material) is an electron-transport material, p-type doping is then performed to the first light emitting layer EML I, so as to enhance the hole-transport ability of the first light emitting layer EML I. The hole-transport ability of the first light emitting layer EML I can be controlled by adjusting the concentration of the p-type dopant; eventually, the hole mobility of the first light emitting layer EML I is equal to the electron mobility of the second light emitting layer EML II. If the material of the light emitting layer (i.e., the applied substrate material) is a hole-transport material, n-type doping is then performed to the second light emitting layer EML II, so as to enhance the electron-transport ability of the second light emitting layer EML II. The electron-transport ability of the second light emitting layer EML II can be controlled by adjusting the concentration of the n-type dopant. Eventually, the hole mobility of the first light emitting layer EML I is equal to the electron mobility of the second light emitting layer EML II. Similarly, the first light emitting layer EML I and the second light emitting layer EML II can both be doped, adjusting the hole mobility of the first light emitting layer EML I and the electron mobility of the second light emitting layer EML II, eventually making the hole mobility of the first light emitting layer EML I equal to the electron mobility of the second light emitting layer EML II.

In a specific implementation, the methods such as TOF (time of flight) and SCLC (space charge limited current) can be used for measuring the carrier mobility of the light emitting layer (i.e., the hole mobility of the first light emitting layer EML I and the electron mobility of the second light emitting layer EML II), thereby determining the concentration of the dopant(s).

Optionally, a material suitable for doping can be used as the substrate material; the substrate material can be 4-(dicyanomethylene)-2-tert-butyl-6-(1,1,7,7-tetramethyljulolidin-4-yl-vin yl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

Optionally, if the substrate material is an electron-transport material, the first light emitting layer is doped with a p-type dopant; the p-type dopant can be 2,3,5,6-tetrafluoro-7,7',8,8'-tetracyanoquinodimethane (F4-TCNQ), tris(4-bromophenyl)aminium hexachloroantimonate (TBAHA), or 4,4',4''-tris(N-(1-naphthyl)-N-phenyl amino)triphenylamine (TNATA). Those skilled in the art can understand that if 2,3,5,6-tetrafluoro-7,7',8,8'-tetracyanoquinodimethane (F4-TCNQ) is used as the substrate material, other dopants except F4-TCNQ can then be used for doping.

Optionally, if the substrate material is an hole-transport material, the second light emitting layer is doped with a n-type dopant; the n-type dopant can be 8-hydroxyquinoline lithium (Liq), lithium fluoride (LiF), tris(2,2'-bipyridyl) chromium (Cr(bpy)$_3$), or tris(2,2'-bipyridyl) ruthenium (Ru (bpy)$_3$).

Optionally, a material with a high hole mobility is used as the hole transport layer; a material of the hole transport layer can be N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl)benzidine (TPTE), or 1,3,5-tris(N-3-methylphenyl-N-phenylamino)benzene (TDAB).

Optionally, a material with a high electron mobility is used as the electron transport layer; a material of the electron transport layer can be 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ).

Optionally, if the organic electroluminescent device is a top-emitting device, the anode layer can be made of a reflective material; if the organic electroluminescent device is a bottom-emitting device, the anode layer can be made of a transparent material; a material of the anode layer can be ITO (In$_2$O$_3$:SnO$_2$), IZO (In$_2$O$_3$:ZnO), GITO (Ga$_{0.08}$In$_{0.28}$Sn$_{0.64}$O$_3$), or ZITO (Zn$_{0.64}$In$_{0.88}$Sn$_{0.66}$O$_3$).

Optionally, if the organic electroluminescent device is a top-emitting device, the cathode layer can be made of a transparent material; if the organic electroluminescent device is a bottom-emitting device, the cathode layer can be made of a reflective material; a material of the cathode layer can be Mg, Ag, Al, Li, K, Ca, Mg$_x$Ag$_{(1-x)}$, Li$_x$Al$_{(1-x)}$, Li$_x$Ca$_{(1-x)}$, or Li$_x$Ag$_{(1-x)}$.

An embodiment of the present invention also provides a method for manufacturing an organic electroluminescent device. The method comprises: stacking an anode layer, a hole transport layer, a first light emitting layer, a second light emitting layer, an electron transport layer, and a cathode layer in sequence; wherein the first light emitting layer and the second light emitting layer comprise a same substrate material; the first light emitting layer and/or the second light emitting layer are doped such that a hole mobility of the first light emitting layer is equal to an electron mobility of the second light emitting layer.

The embodiment of the present invention uses a same substrate material to prepare two light emitting layers, and makes a hole mobility of the first light emitting layer close to the anode equal to an electron mobility of the second light emitting layer close to the cathode. In this way, a balanced injection for electrons and holes is realized, and physical properties of these two light emitting layers are also matched with each other. In the embodiments of the present invention, two light emitting layers with the same substrate material are applied, which can realize a balanced injection for electrons and holes, thereby improving the efficiency and lifetime of the organic electroluminescent device.

Optionally, a material suitable for doping can be used as the substrate material; the substrate material can be 4-(dicyanomethylene)-2-tert-butyl-6-(1,1,7,7-tetramethyljulolidin-4-yl-vin yl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

Optionally, if the substrate material is an electron-transport material, the first light emitting layer is doped with a p-type dopant; the p-type dopant can be 2,3,5,6-tetrafluoro-7,7',8,8'-tetracyanoquinodimethane (F4-TCNQ), tris(4-bromophenyl)aminium hexachloroantimonate (TBAHA), or 4,4',4''-tris(N-(1-naphthyl)-N-phenyl amino)triphenylamine (TNATA). Those skilled in the art can understand that if 2,3,5,6-tetrafluoro-7,7',8,8'-tetracyanoquinodimethane (F4-TCNQ) is used as the substrate material, other dopants except F4-TCNQ can then be used for doping.

Optionally, if the substrate material is an hole-transport material, the second light emitting layer is doped with a n-type dopant; the n-type dopant can be 8-hydroxyquinoline lithium (Liq), lithium fluoride (LiF), tris(2,2'-bipyridyl) chromium (Cr(bpy)$_3$), or tris(2,2'-bipyridyl) ruthenium (Ru (bpy)$_3$).

Optionally, a material with a high hole mobility is used as the hole transport layer; a material of the hole transport layer can be N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl)benzidine (TPTE), or 1,3,5-tris(N-3-methylphenyl-N-phenylamino)benzene (TDAB).

Optionally, a material with a high electron mobility is used as the electron transport layer; a material of the electron transport layer can be 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ).

Optionally, if the organic electroluminescent device is a top-emitting device, the anode layer can be made of a reflective material; if the organic electroluminescent device is a bottom-emitting device, the anode layer can be made of a transparent material; a material of the anode layer can be ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$).

Optionally, if the organic electroluminescent device is a top-emitting device, the cathode layer can be made of a transparent material. If the organic electroluminescent device is a bottom-emitting device, the cathode layer can be made of a reflective material; a material of the cathode layer can be Mg, Ag, Al, Li, K, Ca, $Mg_xAg_{(1-x)}$, $Li_xAl_{(1-x)}$, $Li_xCa_{(1-x)}$, or $Li_xAg_{(1-x)}$.

Figure 3:
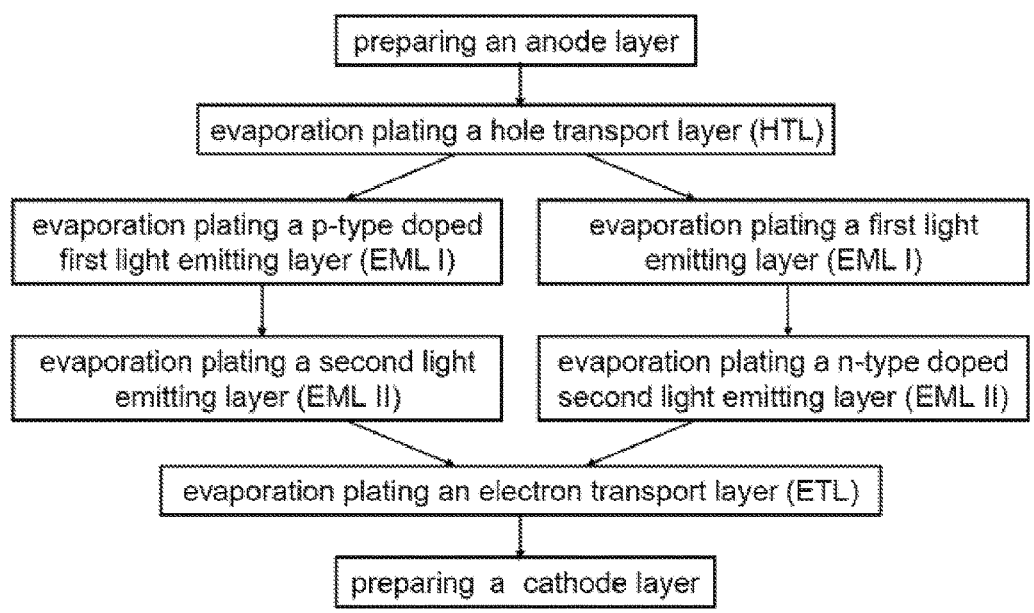
FIG. 3 is a flow chart of a method for manufacturing an organic electroluminescent device provided by the embodiment of the present invention.

FIG. 3 is a flow chart of a method for manufacturing an organic electroluminescent device provided by the embodiment of the present invention. It should be noted that the flow chart shown in FIG. 3 comprises the following two examples of the methods for manufacturing an organic electroluminescent device.

Example 1

1) Sputtering an anode conductive film on a substrate. If the organic electroluminescent device is a top-emitting device, the anode layer can be made of a reflective material. If the organic electroluminescent device is a bottom-emitting device, the anode layer can be made of a transparent material; the material of the anode layer can be ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$);

2) After preparing the anode conductive film, preparing a hole transport layer (HTL) with vacuum evaporation process. Optionally, a material with a high hole mobility is used as the hole transport layer; a material of the hole transport layer can be N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl)benzidine (TPTE), or 1,3,5-tris(N-3-methylphenyl-N-phenylamino)benzene (TDAB), etc.;

3) Preparing a first light emitting layer EML I with vacuum evaporation process, and performing p-type doping to the first light emitting layer EML I simultaneously. Optionally, if the substrate material is an electron-transport material, the first light emitting layer is doped with a p-type dopant; the p-type dopant can be 2,3,5,6-tetrafluoro-7,7',8,8'-tetracyanoquinodimethane (F4-TCNQ), tris(4-bromophenyl)aminium hexachloroantimonate (TBAHA), or 4,4',4"-tris(N-(1-naphthyl)-N-phenyl amino)triphenylamine (TNATA), etc.;

4) Preparing a second light emitting layer EML II with vacuum evaporation process, the material of the second light emitting layer EML II being identical to the material of the first light emitting layer EML I before p-type doping;

5) After preparing the light emitting layer, preparing a electron transport layer (ETL) with vacuum evaporation process. Optionally, a material with a high electron mobility is used as the electron transport layer; a material of the electron transport layer can be 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ), etc.;

6) Evaporation plating a cathode layer with vacuum evaporation process. Optionally, if the organic electroluminescent device is a top-emitting device, the cathode layer can be made of a transparent material; if the organic electroluminescent device is a bottom-emitting device, the cathode layer can be made of a reflective material; a material of the cathode layer can be Mg, Ag, Al, Li, K, Ca, $MgAg_{(1-x)}$, $Li_xAl_{(1-x)}$, $Li_xCa_{(1-x)}$, or $Li_xAg_{(1-x)}$, etc.

Example 2

1) Sputtering an anode conductive film on a substrate. If the organic electroluminescent device is a top-emitting device, the anode layer can be made of a reflective material. If the organic electroluminescent device is a bottom-emitting device, the anode layer can be made of a transparent material. The material of the anode layer can be ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$);

2) After preparing the anode conductive film, preparing a hole transport layer (HTL) with vacuum evaporation process. Optionally, a material with a high hole mobility is used as the hole transport layer. A material of the hole transport layer can be N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl)benzidine (TPTE), or 1,3,5-tris(N-3-methylphenyl-N-phenylamino)benzene (TDAB), etc.;

3) Preparing a first light emitting layer EML I with vacuum evaporation process, the material of the first light emitting layer EML I being identical to the material of the second light emitting layer EML II before n-type doping;

4) Preparing a second light emitting layer EML II with vacuum evaporation process, and performing n-type doping to the second light emitting layer EML II simultaneously. The n-type dopant mainly comprises organic materials with a low work function. Optionally, the n-type dopant can be 8-hydroxyquinoline lithium (Liq), lithium fluoride (LiF), tris(2,2'-bipyridyl) chromium ($Cr(bpy)_3$), or tris(2,2'-bipyridyl) ruthenium ($Ru(bpy)_3$), etc.;

5) After preparing the light emitting layer, preparing a electron transport layer (ETL) with vacuum evaporation process. Optionally, a material with a high electron mobility is used as the electron transport layer; a material of the electron transport layer can be 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ), etc.;

6) Evaporation plating a cathode layer with vacuum evaporation process. Optionally, if the organic electroluminescent device is a top-emitting device, the cathode layer can be made of a transparent material. If the organic electroluminescent device is a bottom-emitting device, the cathode layer can be made of a reflective material; a material of the cathode layer can be Mg, Ag, Al, Li, K, Ca, $Mg_xAg_{(1-x)}$, $Li_xAl_{(1-x)}$, $Li_xCa_{(1-x)}$, or $Li_xAg_{(1-x)}$, etc.

Based on the same inventive concept, an embodiment of the present invention also provides an electronic equipment comprising the above mentioned organic electroluminescent device. The electronic equipment can be any product or component with lighting or display function, such as lighting device, mobile phone, tablet computer, TV, display, notebook computer, digital photo frame, navigator, and so on. The implementation of the electronic equipment can refer to the embodiments of the above mentioned organic electroluminescent device, which will not be repeated herein.

The existing substrate material for the light emitting layer is typically a hole-transport material or an electron-transport material. The embodiment of the present invention uses a same substrate material to prepare two light emitting layers, and makes a hole mobility of the first light emitting layer close to the anode equal to an electron mobility of the second light emitting layer close to the cathode. In this way, a balanced injection for electrons and holes is realized, and physical properties of these two light emitting layers are also matched with each other. In the embodiments of the present invention, two light emitting layers with the same substrate material are applied, which can realize a balanced injection for electrons and holes, thereby improving the efficiency and lifetime of the organic electroluminescent device.

Based on this disclosure, a skilled person in the art can make various modifications and variations to the present invention without departing from the spirit and scope of the present invention. In this way, provided that these modifications and variations of the present invention belong to the scope of the claims of the present invention and the equivalent technologies thereof, the present invention also intends to cover these modifications and variations.

The invention claimed is:

1. An organic electroluminescent device, comprising:
an anode layer, a hole transport layer, a first light emitting layer, a second light emitting layer, an electron transport layer, and a cathode layer stacked in sequence;
wherein the first light emitting layer and the second light emitting layer are in direct contact with each other and comprise the same substrate material; and wherein at least one of the first light emitting layer and the second light emitting layer are doped such that a hole mobility of the first light emitting layer is equal to an electron mobility of the second light emitting layer.

2. The organic electroluminescent device as claimed in claim 1, wherein the substrate material is 4-(dicyanomethylene)-2-tert-butyl-6-(1,1,7,7-tetramethyljulolidin-4-yl-vinyl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

3. The organic electroluminescent device as claimed in claim 1, wherein the first light emitting layer is doped with a p-type dopant; the p-type dopant is 2,3,5,6-tetrafluoro-7,7',8,8'-tetracyanoquinodimethane (F4-TCNQ), tris(4-bromophenyl)aminium hexachloroantimonate (TBAHA), or 4,4',4''-tris(N-(1-naphthyl)-N-phenyl amino)triphenylamine (TNATA).

4. The organic electroluminescent device as claimed in claim 1, wherein the second light emitting layer is doped with a n-type dopant; the n-type dopant is 8-hydroxyquinoline lithium (Liq), lithium fluoride (LiF), tris(2,2'-bipyridyl) chromium (Cr(bpy)$_3$), or tris(2,2'-bipyridyl) ruthenium (Ru(bpy)$_3$).

5. The organic electroluminescent device as claimed in claim 1, wherein a material of the hole transport layer is N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl)benzidine (TPTE), or 1,3,5-tris(N-3-methylphenyl-N-phenylamino)benzene (TDAB).

6. The organic electroluminescent device as claimed in claim 1, wherein a material of the electron transport layer is 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ).

7. The organic electroluminescent device as claimed in claim 1, wherein a material of the anode layer is ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$).

8. The organic electroluminescent device as claimed in claim 1, wherein a material of the cathode layer is Mg, Ag, Al, Li, K, Ca, $Mg_xAg_{(1-x)}$, $Li_xAl_{(1-x)}$, $Li_xCa_{(1-x)}$, or $Li_xAg_{(1-x)}$.

9. A method for manufacturing the organic electroluminescent device as claimed in claim 1, comprising:
stacking an anode layer, a hole transport layer, a first light emitting layer, a second light emitting layer, an electron transport layer, and a cathode layer in sequence;
wherein the first light emitting layer and the second light emitting layer are in direct contact with each other and comprise the same substrate material; and wherein at least one of the first light emitting layer and the second light emitting layer are doped such that a hole mobility of the first light emitting layer is equal to an electron mobility of the second light emitting layer.

10. The method as claimed in claim 9, wherein the substrate material is 4-(dicyanomethylene)-2-tert-butyl-6-(1,1,7,7-tetramethyljulolidin-4-yl-vinyl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

11. The method as claimed in claim 9, wherein the first light emitting layer is doped with a p-type dopant; the p-type dopant is 2,3,5,6-tetrafluoro-7,7', 8,8'-tetracyanoquinodimethane (F4-TCNQ), tris(4-bromophenyl)aminium hexachloroantimonate (TBAHA), or 4,4',4''-tris(N-(1-naphthyl)-N-phenyl amino)triphenylamine (TNATA).

12. The method as claimed in claim 9, wherein the second light emitting layer is doped with a n-type dopant; and wherein the n-type dopant is 8-hydroxyquinoline lithium (Liq), lithium fluoride (LiF), tris(2,2'-bipyridyl) chromium (Cr(bpy)$_3$), or tris(2,2'-bipyridyl) ruthenium (Ru(bpy)$_3$).

13. The method as claimed in claim 9, wherein a material of the hole transport layer is N,N'-bis(1-naphthalenyl)-N,N'-diphenyl-1,1'-biphenyl-4,4'-diamine (NPB), triphenyl-diamine derivative (TPD), N,N'-bis(phenyl)-N,N'-bis(4'-(N,N-bis(phenylamino)-4-biphenyl)benzidine (TPTE), or 1,3,5-tris(N-3-methylphenyl-N-phenylamino)benzene (TDAB).

14. The method as claimed in claim 9, wherein a material of the electron transport layer is 2-(4-biphenylyl)-5-phenyloxadiazole (PBD), 2,5-bis(1-naphthyl)-1,3,5-oxadiazole (BND), or 2,4,6-triphenoxy-1,3,5-triazine (TRZ).

15. The method as claimed in claim 9, wherein a material of the anode layer is ITO ($In_2O_3$:$SnO_2$), IZO ($In_2O_3$:ZnO), GITO ($Ga_{0.08}In_{0.28}Sn_{0.64}O_3$), or ZITO ($Zn_{0.64}In_{0.88}Sn_{0.66}O_3$).

16. The method as claimed in claim 9, wherein a material of the cathode layer is Mg, Ag, Al, Li, K, Ca, $Mg_xAg_{(1-x)}$, $Li_xAl_{(1-x)}$, $Li_xCa_{(1-x)}$, or $Li_xAg_{(l-x)}$.

17. An electronic equipment comprising the organic electroluminescent device as claimed in claim 1.

18. The electronic equipment as claimed in claim 17, wherein the substrate material is 4-(dicyanomethylene)-2-tert-butyl-6-(1,1,7,7-tetramethyljulolidin-4-yl-vinyl)-4H-pyran (DCJTB), 8-hydroxyquinoline aluminum (Alq3), 2,3,5,6-tetrafluoro-7,7',8,8'-tetracyanoquinodimethane (F4-TCNQ), 4,4'-bis(2,2-diphenylvinyl)-1,1'-biphenyl (DPVBi), or 6,6-bis(2-(1-pyrenyl)-4-phenylquinoline) (BPYPQ).

19. The electronic equipment as claimed in claim 17, wherein the first light emitting layer is doped with a p-type dopant; and wherein the p-type dopant is 2,3,5,6-tetrafluoro-7,7',8,8'-tetracyanoquinodimethane (F4-TCNQ), tris(4-bromophenyl)aminium hexachloroantimonate (TBAHA), or 4,4',4''-tris(N-(1-naphthyl)-N-phenyl amino)triphenylamine (TNATA).

20. The electronic equipment as claimed in claim 17, wherein the second light emitting layer is doped with a n-type dopant; and wherein the n-type dopant is 8-hydroxyquinoline lithium (Liq), lithium fluoride (LiF), tris(2,2'-bipyridyl) chromium (Cr(bpy)$_3$), or tris(2,2'-bipyridyl) ruthenium (Ru(bpy)$_3$).

* * * * *